United States Patent
Zhao et al.

(10) Patent No.: US 10,241,176 B2
(45) Date of Patent: Mar. 26, 2019

(54) SYSTEMS AND METHODS FOR STATISTICAL RECONSTRUCTION OF MAGNETIC RESONANCE FINGERPRINTING DATA

(71) Applicant: THE GENERAL HOSPITAL CORPORATION, Boston, MA (US)

(72) Inventors: Bo Zhao, Malden, MA (US); Kawin Setsompop, Cambridge, MA (US); Lawrence Wald, Cambridge, MA (US)

(73) Assignee: The General Hospital Corporation, Boston, MA (US)

( * ) Notice: Subject to any disclaimer, the term of this patent is extended or adjusted under 35 U.S.C. 154(b) by 164 days.

(21) Appl. No.: 15/409,378

(22) Filed: Jan. 18, 2017

(65) Prior Publication Data

US 2017/0205482 A1 Jul. 20, 2017

Related U.S. Application Data

(60) Provisional application No. 62/280,891, filed on Jan. 20, 2016.

(51) Int. Cl.
*G01R 33/56* (2006.01)
*G01R 33/50* (2006.01)

(52) U.S. Cl.
CPC ......... *G01R 33/5608* (2013.01); *G01R 33/50* (2013.01)

(58) Field of Classification Search
CPC .... G01R 33/5608; G01R 33/50; G01R 33/54; G01R 33/56; G01R 33/243; G01R 33/4804; G01R 33/4824
See application file for complete search history.

(56) References Cited

U.S. PATENT DOCUMENTS

| | | | |
|---|---|---|---|
| 8,723,518 B2 | 5/2014 | Seiberlich et al. | |
| 9,633,455 B1* | 4/2017 | Mailhe | G06T 11/008 |
| 2010/0010744 A1* | 1/2010 | Prange | G01V 3/32 |
| | | | 702/7 |
| 2015/0272467 A1* | 10/2015 | Warfield | A61B 5/055 |
| | | | 382/131 |
| 2017/0059682 A1* | 3/2017 | Dagher | G01R 33/243 |
| 2017/0205482 A1* | 7/2017 | Zhao | G01R 33/50 |
| 2017/0234951 A1* | 8/2017 | Zhao | G01R 33/50 |
| | | | 324/309 |
| 2017/0261578 A1* | 9/2017 | Zhao | G01R 33/50 |
| 2018/0225424 A1* | 8/2018 | Kaditz | G01N 33/48792 |

OTHER PUBLICATIONS

Zhao et al, Maximum Likelihood Reconstruction for Magnetic Resonance Fingerprinting, 2015.*
Zhao et al, Maximum Likelihood Reconstruction for Magnetic Resonance Fingerprinting, 2016.*

(Continued)

*Primary Examiner* — Ruifeng Pu
(74) *Attorney, Agent, or Firm* — Quarles & Brady LLP

(57) ABSTRACT

Systems and methods for reconstructing magnetic resonance (MR) tissue parameter maps of a subject from magnetic resonance fingerprinting (MRF) data acquired using a magnetic resonance imaging (MRI) system. The method includes providing MRF data acquired from a subject using an MRI system and performing an iterative, maximum-likelihood reconstruction of the MRF data to create MR tissue parameter maps of the subject.

11 Claims, 8 Drawing Sheets

(56) References Cited

OTHER PUBLICATIONS

Cauley, et al., Fast Group Matching for MR Fingerprinting Reconstruction, Magn. Reson. Med., 2015, 4(2):523-528.
A Compressed Sensing Framework for Magnetic Resonance Fingerprinting, SIAM Journal on Imaging Sciences, 2014, 7(4):2623-2656.
Golub, et al., Separable Nonlinear Least Squares: The Variable Projection Method and Its Applications, Inverse Problems, 2003, 19(2):R1-R26.
Haldar, et al., Maximum Likelihood Estimation of T1 Relaxation Parameters Using VARPRO, Proc. Intl. Soc. Mag. Reson. Med., 2007, 15:41.
Haldar, et al., Super-Resolution Reconstruction of MR Image Sequences with Contrast Modeling, ISBI'09 Proceedings of the Sixth IEEE International Conference on Symposium on Biomedical Imaging: From Nano to Macro, 2009, pp. 266-269.
Jiang, et al., MR Fingerprinting Using Fast Imaging with Steady State Precession (FISP) with Spiral Readout, Magn. Reson. Med., 2015, 74(6):1621-1631.
Ma, et al., Magnetic Resonance Fingerprinting, Nature, 2013, 95(7440):187-192.
McGivney, et al., SVD Compression for Magnetic Resonance Fingerprinting in the Time Domain, IEEE Trans. Med. Imaging, 2014, 33(12):2311-2322.
Ramani, et al., Parallel MR Image Reconstruction Using Augmented Lagrangian Methods, IEEE Trans. Med. Imaging, 2011, 30(3):694-706.
Wang, et al., MRF Denoising with Compressed Sensing and Adaptive Filtering, 2014 IEEE 11th International Symposium on Biomedical Imaging (ISBI), 2014, pp. 870-873.
Ye, et al., Accelerating Magnetic Resonance Fingerprinting (MRF) Using t-Blipped Simultaneous Multi-Slice (SMS) Acquisition, Magn. Reson. Med., 2016, 75(5):2078-2085.
Zhao, et al., Model-Based MR Parameter Mapping with Sparsity Constraints: Parameter Estimation and Performance Bounds, IEEE Trans. Med. Imaging, 2014, 33(9):1832-1844.
Golub, et al., The Differentiation of Pseudo-Inverses and Nonlinear Least Squares Problems Whose Variables Separate, SIAM Journal on Numerical Analysis, 1973, 10(2):413-432.

* cited by examiner

SYSTEMS AND METHODS FOR STATISTICAL RECONSTRUCTION OF MAGNETIC RESONANCE FINGERPRINTING DATA

CROSS-REFERENCE TO RELATED APPLICATIONS

This application is based on, claims priority to, and incorporates herein by reference U.S. Provisional Application Ser. No. 62/280,891, filed Jan. 20, 2016, and entitled "SYSTEMS AND METHODS FOR EFFICIENT RECONSTRUCTION OF MAGNETIC RESONANCE FINGERPRINTING DATA."

STATEMENT REGARDING FEDERALLY SPONSORED RESEARCH

This invention was made with government support under R01EB017219 and R01EB017337 awarded by the National Institutes of Health. The government has certain rights in the invention.

BACKGROUND

MRF is an imaging technique that enables quantitative mapping of tissue or other material properties based on random or pseudorandom measurements of the subject or object being imaged. Examples of parameters that can be mapped include longitudinal relaxation time ($T_1$), transverse relaxation time ($T_2$), and spin or proton density ($\rho$), as well as experiment-specific parameters, such as off-resonance frequency. Advantageously, MRF provides a way to evaluate such parameters in a single, efficient imaging process. MRF is generally described in U.S. Pat. No. 8,723,518, which is herein incorporated by reference in its entirety.

The random or pseudorandom measurements obtained in MRF techniques are achieved by varying the acquisition parameters from one repetition time ("TR") period to the next, which creates a time series of images with varying contrast. Examples of acquisition parameters that can be varied include flip angle, radio frequency ("RF") pulse phase, TR, echo time ("TE"), and sampling patterns, such as by modifying one or more readout encoding gradients. Thus, the success of MRF is largely due to a specialized, incoherent acquisition scheme. More specifically, a sequence of randomized flip angles and repetition times (i.e., $\{(\alpha_m, TR_m)\}_{m=1}^{M}$) is used to generate a sequence of images ($\{I_m(x)\}_{m=1}^{M}$) with randomly varied contrast weightings, yielding incoherence in the temporal domain. Moreover, a set of highly undersampled variable density spiral trajectories can be used to acquire k-space data, which yields the spatial incoherence.

With these incoherently-sampled data, the conventional MRF reconstruction employs a simple template-matching procedure. Given a range of parameters of interest, the procedure uses a "dictionary" that contains all possible signal (or magnetization) evolutions simulated from the Bloch equation. That is, MRF matches an acquired magnetization signal to a pre-computed dictionary of signal evolutions, or templates, that have been generated from Bloch equation-based physics simulations (i.e., Bloch simulations). As a general example, a template signal evolution is chosen from the dictionary if it yields the maximum correlation with the observed signal for each voxel (extracted from the gridding reconstructions). The parameters for the tissue or other material in a given voxel are estimated to be the values that provide the best signal template matching. That is, the reconstructed parameters are assigned as those that generate the selected template.

Although the conventional MRF reconstruction procedures can be relatively robust in practice, there is no theoretic optimality associated with the reconstructed parameter maps. Furthermore, the original, straightforward template matching may not be computationally optimal, or even efficient. Recently, a number of new methods have been proposed to improve MRF reconstruction. Some have attempted to address the computational inefficiencies associated with the conventional MRF reconstruction. Others have proposed new iterative algorithms that leverage signal processing techniques, such as compressed sensing ("CS"), to improve the reconstruction accuracy. Despite these efforts, MRF reconstruction continues to be a challenge, particularly when a large number of tissue parameters are considered in an MRF process.

SUMMARY

The present disclosure overcomes the aforementioned drawbacks by providing a system and method for iterative magnetic resonance fingerprinting (MRF) reconstruction that performs a direct estimation of multiple parameter maps from highly undersampled k-space data, as opposed to the two-step procedure employed by the conventional MRF reconstruction. The reconstruction technique provides a maximum likelihood framework and can be augmented to integrate variable splitting, alternating direction method of multipliers (ADMM), and variable projection (VARPRO) to solve optimization of the maximum likelihood reconstruction problem.

In accordance with one aspect of the disclosure, a magnetic resonance imaging (MRI) system is provided that includes a magnet system configured to generate a polarizing magnetic field about at least a portion of a subject arranged in the MRI system and a plurality of gradient coils configured to apply a gradient field to the polarizing magnetic field. The MRI system also includes a radio frequency (RF) system configured to apply an excitation field to the subject and acquire MR image data from a ROI and a computer system. The computer system is programmed to control the plurality of gradient coils and the RF system to acquire magnetic resonance fingerprinting (MRF) data from a subject and perform an iterative, maximum-likelihood reconstruction of the MRF data to create magnetic resonance (MR) tissue parameter maps of the subject.

In accordance with another aspect of the disclosure, a method is provided for reconstructing MR tissue parameter maps of a subject from magnetic resonance fingerprinting (MRF) data acquired using a magnetic resonance imaging (MRI) system. The method includes providing MRF data acquired from a subject using an MRI system and performing an iterative, maximum-likelihood reconstruction of the MRF data to create MR tissue parameter maps of the subject.

The foregoing and other aspects and advantages of the invention will appear from the following description. In the description, reference is made to the accompanying drawings that form a part hereof, and in which there is shown by way of illustration a preferred embodiment of the invention. Such embodiment does not necessarily represent the full scope of the invention, however, and reference is made therefore to the claims and herein for interpreting the scope of the invention.

DETAILED DESCRIPTION

Figure 1A:
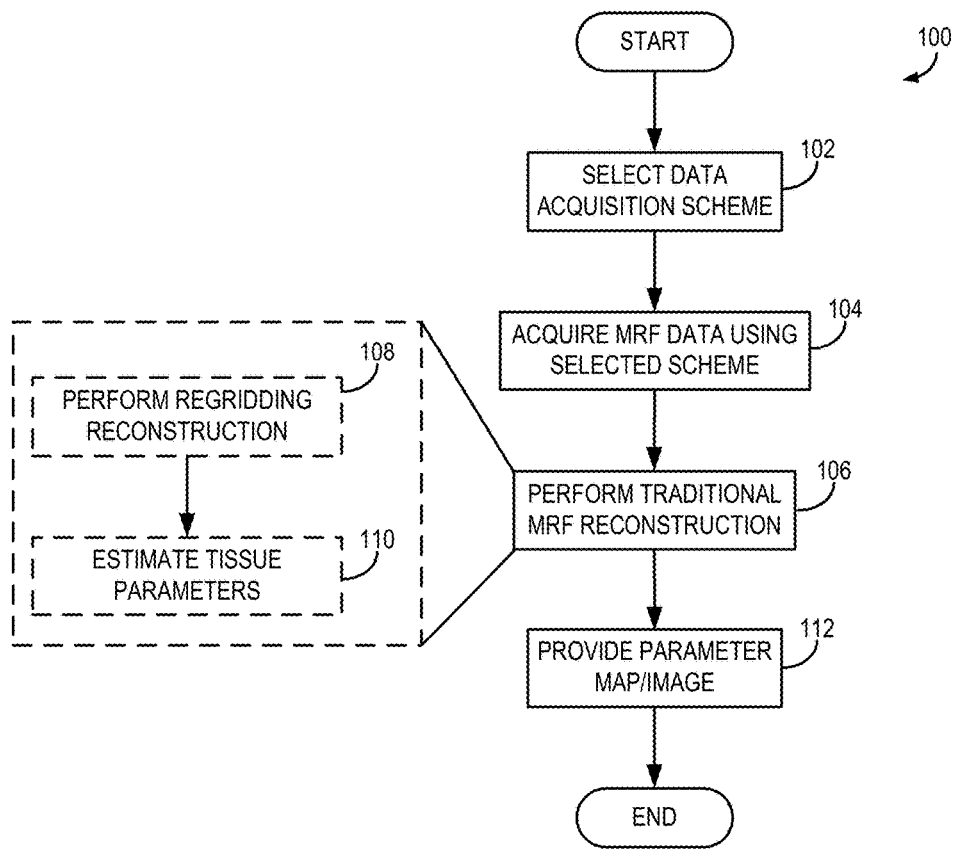
FIG. 1A is a flowchart setting forth steps of a conventional magnetic resonance fingerprinting (MRF) reconstruction method.

As described, magnetic resonance fingerprinting ("MRF") techniques use varying acquisition parameters between different repetition times ("TRs") to create a time series of images with varying contrast. Referring to FIG. 1A, a conventional MRF process 100, at process block 102, begins by selecting a data acquisition scheme that causes signals from different materials or tissues to be spatially and temporally incoherent by continuously varying acquisition parameters throughout the data acquisition process. Examples of acquisition parameters that can be varied include flip angle, radio frequency ("RF") pulse phase, repetition time ("TR"), echo time ("TE"), and sampling patterns, such as by modifying readout encoding gradients. Preferably, the acquisition parameters are varied in a pseudorandom manner but a more regular pattern of acquisition parameter modulation with time can also be employed.

At process block 104, MRF data is acquired using the acquisition scheme or parameters selected at process block 102. As a result of the spatial and temporal incoherence imparted by this acquisition scheme, each material or tissue is associated with a unique signal evolution or "fingerprint," that is a function of multiple different physical parameters, including longitudinal relaxation time, $T_1$, transverse relaxation time, $T_2$, and proton density, $\rho$. As will be described, the present disclosure provides a framework for an iterative reconstruction process that may begin by selecting initial tissue parameters at process block 106.

In a conventional MRF process 106, a simple template-matching procedure is performed. In particular, such a conventional approach to MRF reconstruction first performs gridding reconstructions from highly-undersampled data (e.g., a spiral acquisition with 48× acceleration) at process block 108 to obtain a sequence of aliasing-artifact corrupted MRF time-series images. From these images, the underlying tissue parameters are then estimated by comparison to a dictionary of signal evolutions at process block 110. Once the matching signal evolutions are identified at process block 110, tissue parameter maps are provided at process block 112.

Conventional MRF reconstruction stops after such a reconstruction process 106. However, if used, this initial process only represents an initial selection of parameters because the present disclosure recognizes that the conventional MRF reconstruction process suffers from a number of key limitations. First, it is heuristic and statistically suboptimal, because the noise in the gridding reconstructions at process block 108 no longer follows a white Gaussian distribution. Such sub-optimality often leads to severe bias in the subsequent parameter estimation at process block 110. Second, low-quality MRF time-series images from the gridding reconstructions make the accuracy of tissue parameter estimation at process block 110 heavily dependent on the length of data acquisition, especially for certain parameters, such as $T_2$ maps. Achieving accurate estimates of tissue parameters often requires a relatively long acquisition sequence. Third, the conventional approach 108 is only integrated with multichannel acquisitions in an ad-hoc way, which does not fully exploit the SNR benefit offered by the phased array coils.

Figure 1B:
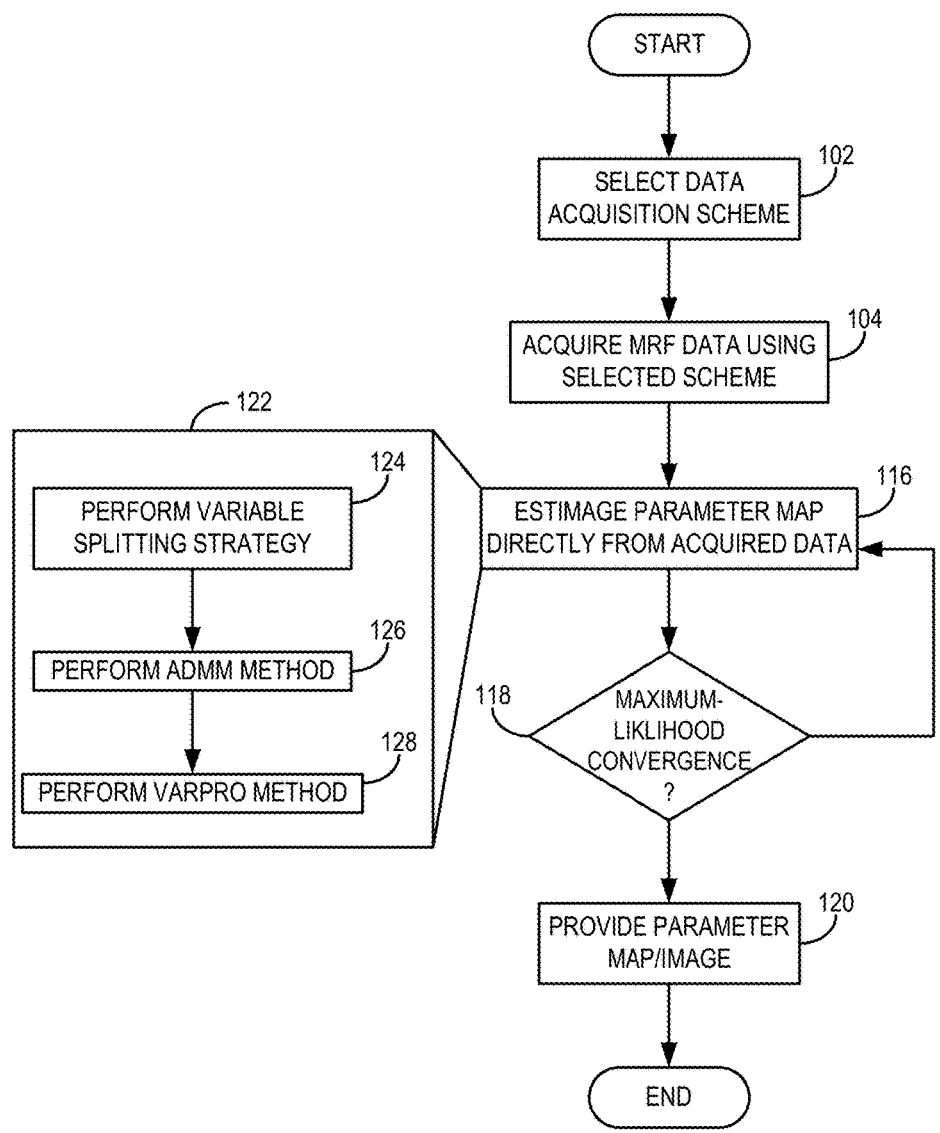
FIG. 1B is a flowchart setting forth an example of steps of an example maximum likelihood reconstruction method for MRF data in accordance with the present disclosure.

Referring to FIG. 1B, to overcome these issues, a new, maximum-likelihood (ML) MRF image reconstruction technique 116 is provided. Data acquisition scheme section at process block 102 and data acquisition at process block 104 are substantially similar to the process described above with respect to FIG. 1A, with the notable exception that, as will be described, the ML MRF image reconstruction technique described herein can provide similar results to the conventional MRF reconstruction process 106 with a substantially reduced acquisition time at process block 104. For example, as will be described, a reduction in acquisition time by a factor of two has been shown, while achieving similar accuracy to that of the conventional MRF reconstruction 106.

As will be described, the ML-MRF reconstruction technique described herein establishes a maximum likelihood reconstruction framework to model the underlying data generating process, including the Bloch equation based magnetization dynamics and noise characteristics. Specifically, at process block 116, the ML-based formulation can be used to reconstruct multiple MR tissue parameters directly from highly-undersampled k-space data.

As described above, given a range of parameters of interest, in conventional ML-MRF reconstruction, the data acquired at process block 104 is compared against a "dictionary" that contains all possible signal (or magnetization) evolutions simulated from the Bloch equation. Traditionally, during an MRF reconstruction, a template signal evolution is chosen from the dictionary if it yields the maximum correlation with the observed signal for each voxel (extracted from the gridding reconstructions). The parameters for the tissue or other material in a given voxel are estimated to be the values that provide the best signal template matching. That is, the reconstructed parameters are assigned as those that generate the selected template.

At process block 116, the present disclosure provides a way to improve the MRF image reconstruction. Specifically, the present disclosure recognizes that contrast-weighted images ("$I_m$") created from MRF data can be parameterized, for example, as:

$$I_m(x) = \rho(x)\phi_m(T_1(x), T_2(x), f_0(x))$$ Eqn. 1;

for m=1, ..., M, where $\phi_m(\cdot)$ denotes the contrast-weighting function at the mth time instant, $\rho(x)$ denotes the spin density map, $T_1(x)$ denotes the longitudinal relaxation map, $T_2(x)$ denotes the transverse relaxation map, and $f_0(x)$ denotes the off-resonance map. Note that $\phi_m(\cdot)$ is determined by the Bloch equation based magnetization dynamics, driven by acquisition parameters up to the mth time instant (i.e., $\{\alpha_i, TR_i\}_{i=1}^m$). However, distinct from conventional MR parameter mapping, the analytical form of $\phi_m(\cdot)$ can be difficult to obtain in MRF, though it is feasible to determine $\phi_m$ numerically through Bloch simulations.

After spatial discretization, equation 1 can be written as:

$$I_m = \Phi_m(T_1, T_2, f_0)\rho$$ Eqn. 2;

where both $I_m$ and $\rho$ are N×1 complex vectors, $T_1(x)$, $T_2(x)$, and $f_0(x)$ are all N×1 real vectors, and $\Phi_m(\cdot) \in \mathbb{C}^{N \times N}$ is a diagonal matrix with $[\Phi_m]_{n,n} = \phi_m(T_1[n], T_2[n], f_0[n])$. Furthermore, the discrete imaging equation for MRF can be written as:

$$d_{m,c} = F_m S_c I_m + n_{m,c}$$ Eqn. 3;

where $d_{m,c} \in \mathbb{C}^P$ contains the measured k-space data from the cth receiver coil, $F_m \in \mathbb{C}^{P \times N}$ denotes the undersampled Fourier encoding matrix for the mth time instant, $S_c \in \mathbb{C}^{N \times N}$ is a diagonal matrix whose diagonal entries contain the coil sensitivities, and $n_{m,c} \in \mathbb{C}^{P \times 1}$ denotes the noise vector. Substituting equation 2 into equation 3, the following data model can be obtained:

$$d_{m,c} = F_m S_c \Phi_m(T_1, T_2, f_0)\rho + n_{m,c}$$ Eqn. 4;

The goal of MRF reconstruction is to reconstruct the parameters of interest, $\{T_1, T_2, f_0, \rho\}$, from $\{d_{m,c}\}_{m,c=1}^{M,M_c}$. The present disclosure recognizes that the data model in equation 4 and the noise distribution is a useful construct for conceptualizing reconstruction in MRF. In particular, with this construct, the reconstruction problem can be formulated as a maximum likelihood ("ML") estimation problem. With respect to noise statistics, we assume: 1) for a fixed m and c, $n_{m,c}$ can be modeled as additive complex white Gauss noise; 2) $n_{m,c_1}$ is correlated with $n_{m,c_2}$, if $c_1 \neq c_2$; 3) $n_{m_1,c_1}$ is independent of $n_{m_2,c_2}$, whenever $m_1 \neq m_2$. For multichannel acquisitions, we further assume that the noise covariance matrix is known, with which we can pre-whiten the colored Gaussian noise. Under the above assumptions, the ML reconstruction from MRF data can be formulated as:

$$\{\hat{T}_1, \hat{T}_2, \hat{f}_0, \hat{\rho}\} =$$ Eqn. 5

$$\arg\min_{T_1,T_2,f_0,\rho} \sum_{c=1}^{N_c} \sum_{m=1}^{M} \|d_{m,c} - F_m S_c \Phi_m(T_1, T_2, f_0)\rho\|_2^2.$$

Thus, at process block 108, equation 5 can be used at process block 116 to perform a direct estimation of multiple parameter maps from highly undersampled k-space data, as opposed to the two-step procedure employed by the conventional MRF reconstruction. As indicated at decision block 118, the process is iterative, such that each estimate at process block 116 is checked at decision block 118 for convergence of the maximum-likelihood construct presented by equation 5. This process continues until convergence, whereby a resulting parameter map is delivered at process block 120 and process ends.

Notably, however, equation 5 results in a nonlinear least-squares problem. As such, there are a number of key challenges associated with solving this problem. Most importantly, the lack of an analytical expression of $\phi_m(\cdot)$ makes it cumbersome to approach the problem using the standard nonlinear optimization methods, such as nonlinear conjugate gradient ("CG") method. Furthermore, the present disclosure recognizes that equation 5 is nonconvex in general (even the simplest form of signal evolution from conventional MR parameter mapping renders the cost function nonconvex). Last but not least, there are a large number of unknown parameters in equation 5, which are at very distinct scales.

Accordingly, the present disclosure provides a solution technique for the ML reconstruction from MRF data that is efficient and overcomes these challenges of a nonlinear least-squares problem. In particular, the process described above may be augmented with the solution technique 122 of the present disclosure, which can integrate a variable splitting strategy at process block 124, an alternating direction method of multipliers at process block 126, and a variable projection method at process block 128.

For simplicity of notation, hereafter, $\theta$ represents the MR tissue parameters being analyzed by a given MRF study. To this end, in the non-limiting example provided above, $\theta = \{T_1, T_2, f_0\}$, which are the above-described unknown parameters in $\Phi_m(\cdot)$. Of course, other parameters could be included or considered in a given MRF study and, in those cases, $\theta$ represents such parameters.

First, at process block 124, to address the optimization problem in equation 5, a set of auxiliary variables $\{g_m\}_{m=1}^M$ is introduced to split the parametric image model in equation 2 from the data consistency term in equation 5, and a set of auxiliary variables $\{h^{m,c}\}_{m,c=1}^{M,N_c}$ is introduced to split the coil sensitivities. Equivalently, the following constrained optimization problem can be solved as:

$$\min_{\rho,\theta,\{g_m\},\{h_{m,c}\}} \sum_{c=1}^{N_c} \sum_{m=1}^{M} \|d_m - F_m h_{m,c}\|_2^2,$$ Eqn. 6 s.t. $g_m = \Phi_m(\theta)\rho$, and $h_{m,c} = S_c g_m$, $m = 1, \ldots, M, c = 1, \cdots, N_c$.

Second, at process block 126, the alternating direction method of multipliers (ADMM) algorithm is applied to solve equation 6. Specifically, the following augmented Lagrangian function is iteratively minimized:

$$\mathcal{L}_A(\rho, \theta, \{g_m\}, \{y_m\}) =$$ Eqn. 7

$$\sum_{m=1}^{M} \sum_{c=1}^{N_c} \left\{ \|d_m - F_m h_{m,c}\|_2^2 + \text{Re}(\langle x_{m,c}, h_{m,c} - S_c g_m \rangle) + \frac{\mu_h}{2} \|h_{m,c} - S_c g_m\|_2^2 \right\} +$$

-continued $$\sum_{m=1}^{M}\left\{\text{Re}(\langle y_m, g_m - \Phi_m(\theta)p\rangle) + \frac{\mu_g}{2}\left\|g_m - \Phi_m(\theta)\rho\right\|_2^2\right\};$$

where Re(•) denotes the real part of a complex number, $y_m \in \mathbb{C}^N$ is the Lagrangian multiplier, and $\mu > 0$ is the penalty parameter. The solution to Eqn. 7 consists of solving the following sub-problems at each iteration:

$$\{\rho^{(k+1)}, \theta^{(k+1)}\} = \underset{\rho,\theta}{\text{argmin}}\, \mathcal{L}_A(\rho, \theta, \{g_m^{(k)}\}, \{h_{m,c}^{(k)}\}); \qquad \text{Eqn. 8}$$

$$\{g_m^{(k+1)}\} = \underset{\{g_m\}}{\text{argmin}}\, \mathcal{L}_A(\rho^{(k+1)}, \theta^{(k+1)}, \{g_m\}, \{h_{m,c}^{(k)}\}); \qquad \text{Eqn. 9}$$

$$\{h_{m,c}^{(k+1)}\} = \underset{\{h_{m,c}\}}{\text{arg min}}\, \mathcal{L}_A(\rho^{(k+1)}, \theta^{(k+1)}, \{g_m^{(k+1)}\}, \{h_{m,c}\}); \qquad \text{Eqn. 10}$$

and updating the Lagrangian multipliers:

$$x_{m,c}^{(k+1)} = x_{m,c}^{(k)} + \mu_h[h_{m,c}^{(k+1)} - S_c g_m^{(k+1)}]$$

And $$y_m^{(k+1)} = y_m^{(k)} + \mu_g[g_m^{(k+1)} - \Phi(\theta^{(k+1)})\rho^{(k+1)}]$$

Equations 8, 9, and 10 can be solved as will be described. As will be described, $\rho$ and $\theta$ can be updated. The optimization problem in equation 8 can be rewritten as:

$$\{\rho^{(k+1)}, \theta^{(k+1)}\} = \underset{\rho,\theta}{\text{argmin}} \sum_{m=1}^{M} \left\|g_m^{(k)} + \frac{y_m^{(k)}}{\mu_g} - \Phi_m(\theta)\rho\right\|_2^2; \qquad \text{Eqn. 11}$$

which can be decoupled for each voxel as:

$$\{\rho_n^{(k+1)}, \theta_n^{(k+1)}\} = \underset{\rho_n,\theta_n}{\text{argmin}} \sum_{m=1}^{M} \left|g_{m,n}^{(k)} + \frac{y_{m,n}^{(k)}}{\mu_g} - \phi_m(\theta_n)\rho_n\right|_2^2; \qquad \text{Eqn. 12}$$

For n=1, . . . , N, where $\rho_n$ and $\theta_n$ respectively denote the spin density and other parameters at the nth voxel, and $g_{m,n}$ and $y_{m,n}$ denote the nth element of $g_m$ and $y_m$. A matrix-vector form of equation 12 can then be written as:

$$\{\rho_n^{(k+1)}, \theta_n^{(k+1)}\} \underset{\rho_n,\theta_n}{\text{argmin}} \|u_n^{(k)} - z(\theta_n)\rho_n\|_2^2; \qquad \text{Eqn. 13}$$

where $$u_n^{(k)} = \left[g_{1,n}^{(k)} + \frac{y_{1,n}^{(k)}}{\mu_g}, \dots, g_{M,n}^{(k)} + \frac{y_{M,n}^{(k)}}{\mu_g}\right]^T \in \mathbb{C}^M$$

and $$z(\theta_n) = [\phi_1(\theta_n), \dots, \phi_M(\theta_n)]^T \in \mathbb{C}^M.$$

Note that equation 13 is a separable nonlinear least-squares problem, for which a special class of efficient processes based on variable projection (VARPRO), such as described in G. Golub and V. Pereyra, "Separable nonlinear least squares: the variable projection method and its applications," Inverse Probl., vol. 19, pp. R1-R26, 2003 and J. P. Haldar, J. Anderson, and S. W. Sun, "Maximum likelihood estimation of T1 relaxation parameters using VARPRO," in Proc. Int. Symp. Magn. Reson. Med., 2007, p. 41., both of which are incorporated herein by reference in its entirety, can be applied.

Specifically, at process block 128, the VARPRO method exploits the fact that, with a given value of $\theta_n$, the update of $\rho_n$ has the following closed form solution due to the separate structure of equation 13:

$$\rho_n^{(k+1)} = z^+(\theta_n)u_n^{(k)} \qquad \text{Eqn. 14;}$$

where $z^+$ is the pseudo-inverse of z. Substituting equation 14 into equation 13, gives:

$$\theta_n^{(k+1)} = \underset{\theta}{\text{argmin}} \|[I - z(\theta_n)z^+(\theta_n)]u_n^{(k)}\|_2^2; \qquad \text{Eqn. 15}$$

where I is an M×M identity matrix. Solving equations 14 and 15 together can be shown to yield the same set of optional solutions as equation 13. Furthermore, noting that $zz^+$ is an orthogonal projector, the minimization problem in equation 15 is equivalent to:

$$\underset{\theta_n}{\max} \|z(\theta_n)z^+(\theta_n)u_n^{(k)}\|_2^2. \qquad \text{Eqn. 16}$$

Nothing the fact that $$\|zz^+u\|_2^2 = \frac{\|zz^Hu\|_2^2}{\|z\|_2^4} = \frac{|z^Hu|^2}{\|z\|_2^2},$$

equation 16 can be solved by:

$$\theta_n^{(k+1)} = \underset{\theta_n}{\text{argmax}} \frac{|\langle u_n^{(k)}, z(\theta_n)\rangle|}{\|z(\theta_n)\|_2}; \qquad \text{Eqn. 17}$$

which is equivalent to:

$$\theta_n^{(k+1)} = \underset{\theta_n}{\text{argmax}} \frac{|\langle u_n^{(k)}, z(\theta_n)\rangle|}{\|z(\theta_n)\|_2 \|u_n^{(k)}\|_2}. \qquad \text{Eqn. 18}$$

Substituting the above $\theta_n^{(k+1)}$ from equation 18 into equation 14, and also using the fact that $z^+ = z^H/\|z\|_2^2$, gives:

$$\rho_n^{(k+1)} = \frac{\langle u_n^{(k)}, z(\theta_n^{(k+1)})\rangle}{\|z(\theta_n^{(k+1)})\|_2^2}. \qquad \text{Eqn. 19}$$

Although updating $\rho$ and $\theta$ has been reduced to solving equation 18 and equation 19, there exists no analytical form of $\phi_m(\bullet)$. However, equation 18 can be reformulated as a discrete optimization problem. More specifically, the feasible search space of $\{T_1, T_2, f_0\}$ can be discretized into a finite set of parameters $\{v_q\}_{q=1}^Q$ (where $v \in \mathbb{R}^3$), with which Bloch simulations can be used to generate a dictionary that contains all possible signal evolutions (i.e., $\{z_q(v_q)\}_{q=1}^Q$).

After that, a global optimization of equation 18 can be performed through a search, which is given by:

$$\hat{q}_n = \arg\max_{q=1,\ldots,Q} \frac{|\langle u_n^{(k)}, z_q(v_q)\rangle|}{\|z_q(v_q)\|_2 \|u_n^{(k)}\|_2}. \quad \text{Eqn. 20}$$

Correspondingly, we have:

$$\theta_n^{(k+1)} = v_{\hat{q}_n}, \quad \text{Eqn. 21}$$

$$\rho_n^{(k+1)} = \frac{\langle u_n^{(k)}, z_{\hat{q}_n}(\theta_n^{(k+1)})\rangle}{\|z_{\hat{q}_n}(\theta_n^{(k+1)})\|_2^2}.$$

Also, $\{g_m\}$ can be updated as will be described. In particular, note that the optimization problem in equation 9 is a linear least-squares problem, whose solution can be determined by solving:

$$\left(\frac{\mu_h}{2}\sum_{c=1}^{N_c} S_c^H S_c + \frac{\mu_g}{2} I\right) g_m = u^{(k+1)} \quad \text{Eqn. 23}$$

where $$u^{(k+1)} = \frac{\mu_g}{2}\left[\Phi_m(\theta^{(k+1)})\rho^{(k+1)} - \frac{1}{\mu_g}y_m^{(k)}\right] + \frac{\mu_h}{2}\sum_{c=1}^{N_c} S_c^H\left(h_{m,c}^{(k)} + \frac{1}{\mu_h}x_{m,c}^{(k)}\right);$$

Since the matrix coefficient of the linear system in equation 23 is a diagonal matrix, equation 23 can be solved by an entry-by-entry inversion.

The subproblem of equation 10 is also a linear least-squares problem, which is decoupled for each $h_{m,c}$. Its solution can be obtained by solving $$\left(F_m^H F_m + \frac{\mu_h}{2} I\right) h_{m,c}^{(k+1)} = F_m^H d_{m,c} + v^{(k+1)}, \text{ where}$$

$$v^{(k+1)} = \frac{\mu_h}{2}\left(S_c g_m^{(k+1)} - \frac{1}{\mu_h} x_{m,c}^{(k)}\right).$$

A number of numerical solvers can be used, such as the preconditioned CG algorithm.

For the proposed iterative process, at a first pass of process block 116, $x_{m,c}^{(0)}=0$, $y_m^{(0)}=0$, $g_m^{(0)}$ with the gridding reconstruction, and $h_{m,c}^{(0)}=S_c g_m^{(0)}$. In this case, the first iteration through process block 116 and 118 produces the conventional MRF reconstruction. Furthermore, note that equation 5 is a nonlinear and non-convex optimization problem, the solution of which can be dependent on initializations. Empirical observation showed that, with a gridding reconstruction as an initialization, the above-described method consistently yields advantageous reconstruction results as will be further described. However, the following initializations are non-limiting examples and other initializations may be desirable and/or provide improved performance in particular settings.

The above-described process was studied. The following example is non-limiting. A numerical brain phantom from the Brainweb database was used (containing the spin density, $T_1$ and $T_2$ maps). In this non-limiting example, off-resonance frequencies were assumed to be zero for all voxels. Bloch simulations were performed to generate a sequence of contrast-weighted images using the balanced steady-state free precession pulse sequence with the same set of flip angles and repetition times as in D. Ma, V. Gulani, N. Seiberlich, K. Liu, J. L. Sunshine, J. L. Duerk, and M. A. Griswold, "Magnetic resonance fingerprinting," Nature, vol. 495, pp. 187-192, 2013, which is incorporated herein by reference. For data acquisition, k-space data were acquired using only one simulated spiral interleaf at each time instant (the fully-sampled data contained 48 interleaves), and different interleaves were used for different time instants. Moreover, complex white Gaussian noise was added to measured data such that the signal-to-noise ratio is 45 dB.

Reconstructions of the $T_1$, $T_2$, and spin density maps were performed using both the conventional MRF method and the above-described ML-MRF method. The ML-MRF process was initialized with the gridding reconstruction, and the maximum number of iterations was set as $K_{max}=30$. Moreover, the penalty parameters, $\mu_h$ and $\mu_g$, were empirically selected to optimize the performance of the ML-MRF process.

Figure 2A:
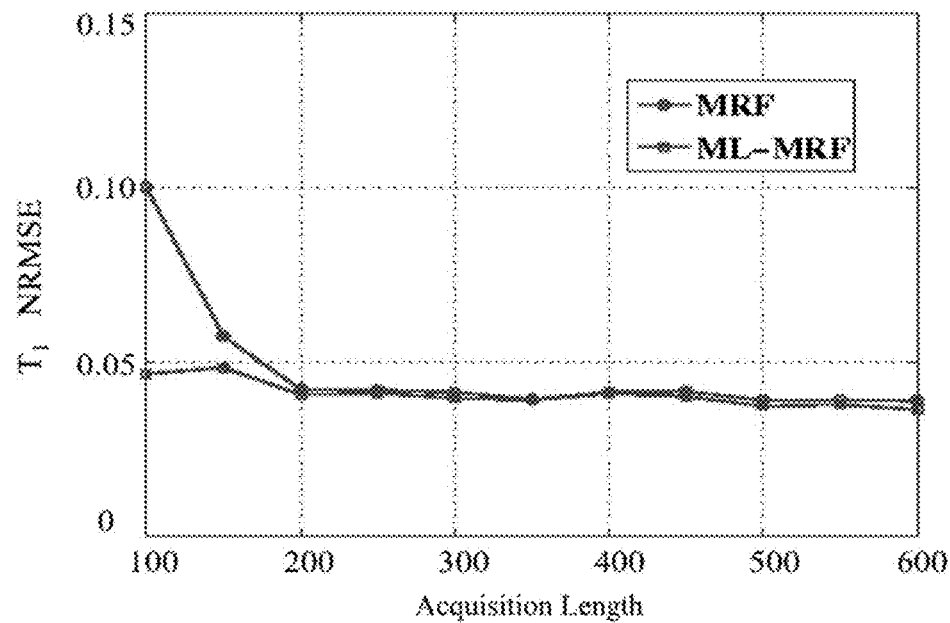
FIG. 2A is a graph illustrating comparable $T_1$ parameter estimates achieved using the maximum likelihood reconstruction technique of the present disclosure when compared to a conventional MRF reconstruction method.
Figure 2B:
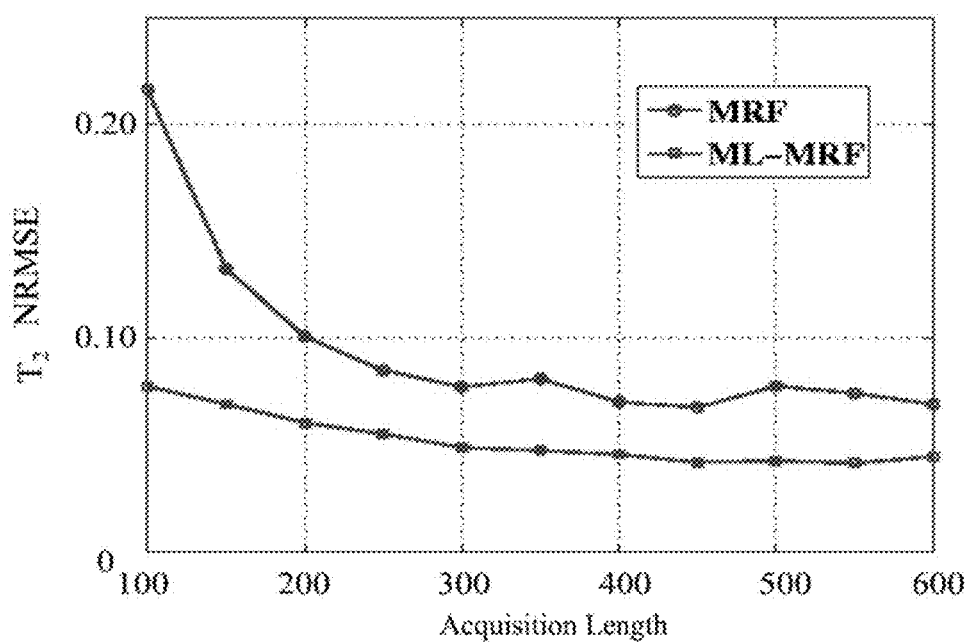
FIG. 2B is a graph illustrating superior $T_2$ parameter estimates achieved using the maximum likelihood reconstruction technique of the present disclosure when compared to a conventional MRF reconstruction method.
Figure 2C:
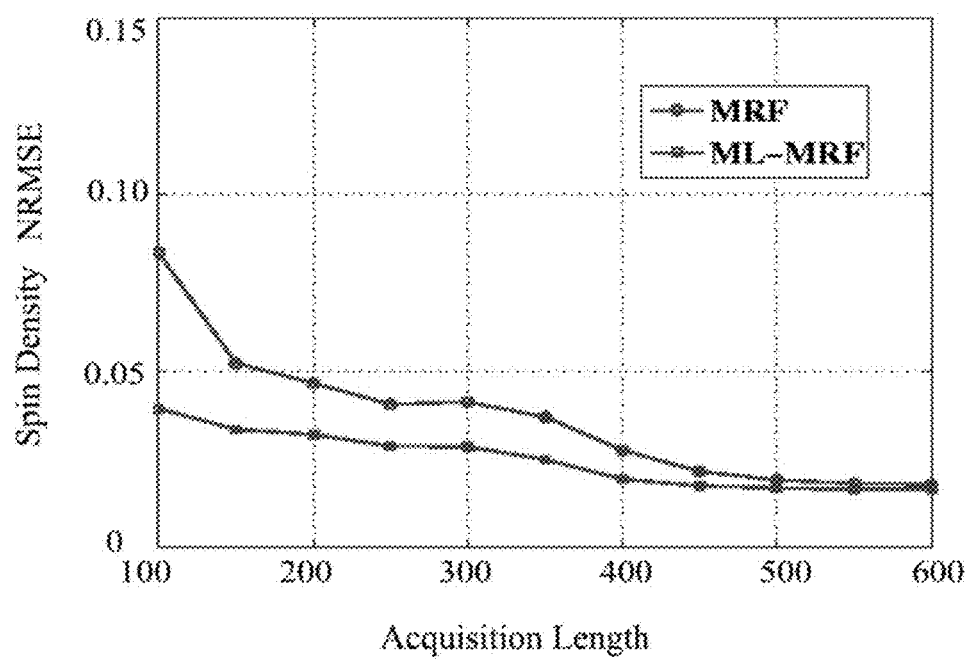
FIG. 2C is a graph illustrating superior spin density parameter estimates achieved using the maximum likelihood reconstruction technique of the present disclosure when compared to a conventional MRF reconstruction method.

Specifically, FIGS. 2A through 2C, are graphs that compare the normalized root-mean-square error (NRMSE) of $T_1$, $T_2$, and spin density maps, respectively, obtained using the conventional MRF and ML-MRF with different acquisition lengths. As can be seen in FIGS. 2A-2C, ML-MRF results in more accurate estimates of $T_1$, $T_2$, and spin density values at all acquisition lengths, while the improvement for $T_2$ and spin density is more significant. In particular, FIG. 2B shows the estimated $T_2$ from ML-MRF with the acquisition length M=250 is better than that from conventional MRF using M=500. Representative reconstruction results from the above two methods using M=250, also illustrated the superiority of the MR-MRF technique. The $T_2$ and spin density maps obtained by ML-MRF exhibited substantially reduced artifacts and errors, which is consistent with the error plots of FIGS. 2B and 2C.

Figure 2D:
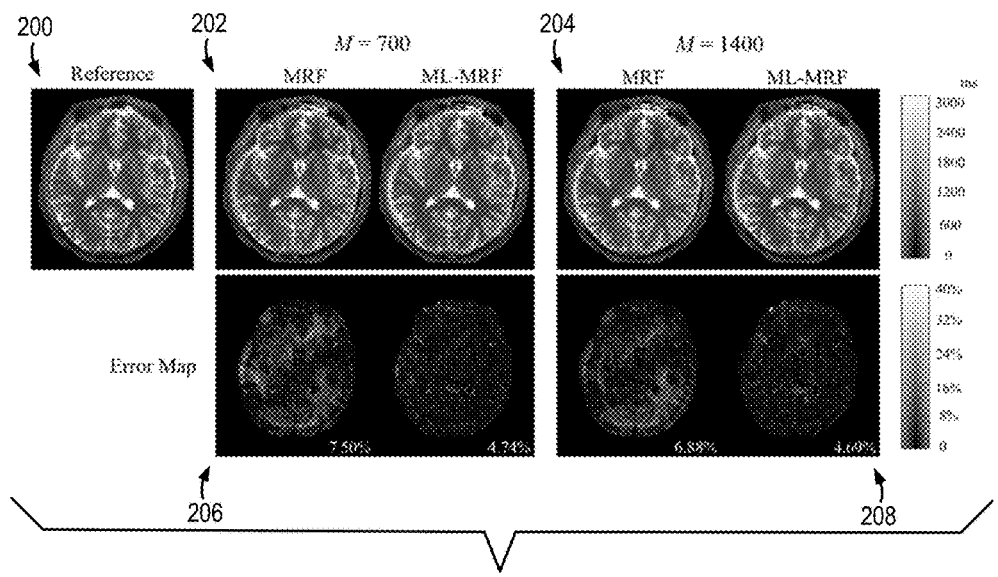
FIG. 2D is a collection of images showing $T_1$ maps obtained using reference data, conventional MRF reconstruction and ML-MRF techniques, along with the error therebetween.
Figure 2E:
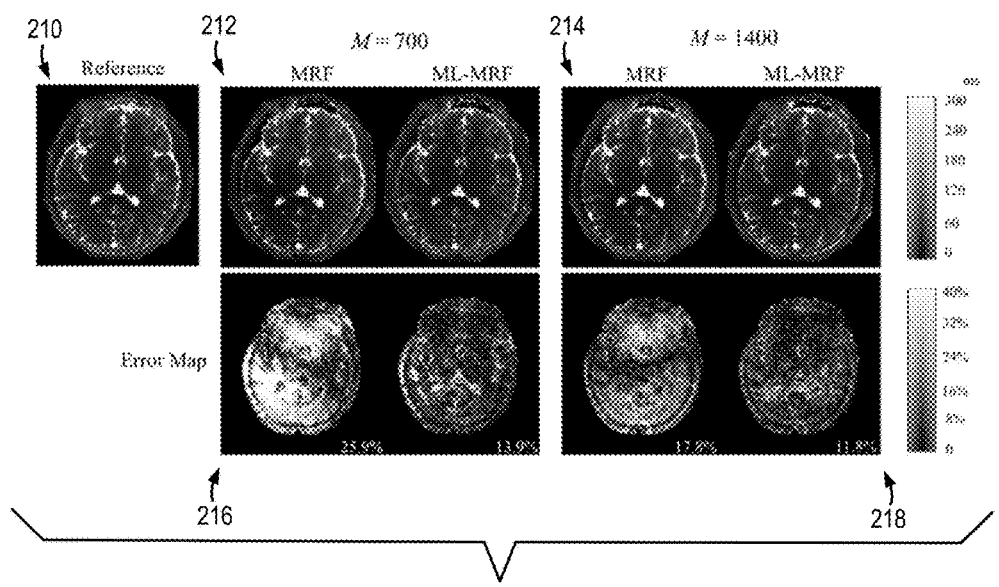
FIG. 2E is a collection of images showing $T_2$ maps obtained using reference data, conventional MRF reconstruction and ML-MRF techniques, along with the error therebetween.
Figure 2F:
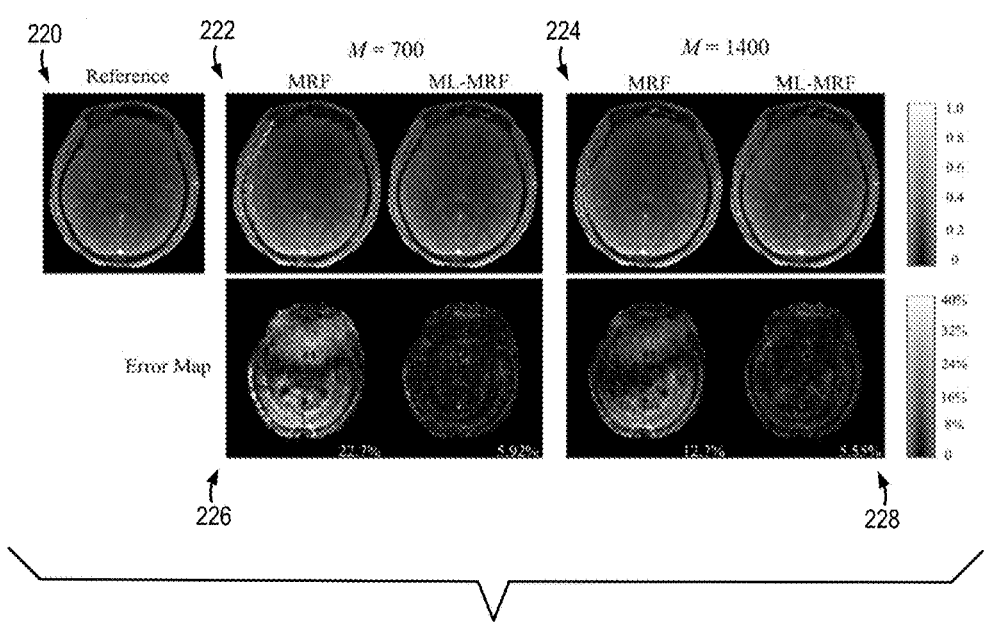
FIG. 2F a collection of images showing spin density maps obtained using reference data, conventional MRF reconstruction and ML-MRF techniques, along with the error therebetween.

For example, referring to FIGS. 2D through 2F, shows, respectively, the $T_1$, $T_2$, and spin density maps obtained from the reference, conventional MRF reconstruction, and ML-MRF techniques. More particularly, FIGS. 2D through 2F show in vivo images of slice 1 with two acquisition lengths. FIG. 2D provides a reference $T_1$ map from fully sampled data 200 along with $T_1$ maps reconstructed using conventional MRF and ML-MRF, at M=700 and M=1400, 202, 204. In addition to the reconstructed $T_1$ maps 202, 204, associated relative error maps 206, 208 are provided. Similarly, FIG. 2E provides a reference $T_2$ map 210 along with $T_2$ maps reconstructed using conventional MRF and ML-MRF, at M=700 and M=1400, 212, 214. In addition to the reconstructed $T_2$ maps 212, 214, associated relative error maps 216, 218 are provided. Further, FIG. 2F provides a reference spin density map 220 along with spin density maps reconstructed using conventional MRF and ML-MRF, at M=700 and M=1400, 222, 224. In addition to the reconstructed spin density maps 222, 224, associated relative error maps 226, 228 are provided. In each of FIGS. 2D through 2E, the overall error is labeled at the lower right corner of each error map.

The relative error maps 206, 208, 216, 218, 226, 228 and overall error value associated with each reconstruction for quantitative assessment are shown. Clearly, both methods yield improved performance, as the number of measurements doubles. However, ML-MRF outperforms the conventional MRF reconstruction for both acquisition lengths.

Also, note that ML-MRF with M=700 results in even higher accuracy than the conventional approach with M=1400.

Therefore, the present disclosure provides a statistical estimation framework for the reconstruction of MRF data. More particularly, systems and methods described in the present disclosure can be referred to as a maximum-likelihood MRF reconstruction method or technique. The ML-MRF technique may be initialized to provide the results of a conventional MRF reconstruction as its first iteration, while rapidly improving reconstruction quality with additional iterations. That is, advantageously, initialization of the iterative process can be selected to match the results of the conventional MRF reconstruction. Specifically, the iterative process can be initialize to reproduce the conventional MRF reconstruction as its first iteration, while improving the accuracy with subsequent iterations. In this sense, the proposed method produces better reconstruction quality than the convention MRF reconstruction approach. For example, in vivo MRF experiments showed that the above-described ML-MRF reconstruction can produce superior results using a reduced acquisition time compared to using the conventional MRF reconstructions, which rely on longer acquisitions to make parameter selection accurate. For example, the ML-MRF reconstruction can be used to reduce acquisition times by a factor of two, compared to the conventional approach, for achieving a similar accuracy levels.

Within the statistical reconstruction, the estimation-theoretic bounds can be derived to characterize parameter estimation performance. This provides error bars for reconstructed MR tissue parameters. Note that the ML reconstruction is asymptotically unbiased, and that the covariance of the ML estimator asymptotically achieves the Cramer-Rao bound (CRB), (i.e., a lower bound on covariance of any unbiased estimator). The latter property can be used to provide error bars for the ML estimates of MR tissue parameters. Denoting $\theta$ and $\hat{\theta}$ as true MR tissue parameters and estimated tissue parameters, respectively, the CRB can be expressed as:

$$E[(\theta-\hat{\theta})(\theta-\hat{\theta})^T] \geq J^+(\theta) \quad \text{Eqn. 24;}$$

where $J(\theta)$ is the Fisher information matrix (FIM). Note that to obtain the bound on the voxel level, the diagonal entries of the FIM can be extracted. The CRB is further described, for example, in M. Kay, Fundamentals of Statistical Signal Processing: Estimation Theory, Upper Saddle River, N.J.: Prentice Hall, Vol. I., which is incorporated herein by reference in its entirety.

Within the statistical reconstruction framework, the above-described ML-MRF technique can be readily integrated with various types of regularization (e.g., low-rank or sparse modeling) to obtain a maximum a posterior (MAP) optimal solution. One of key benefits offered by the MAP solution is to gain additional SNR efficiency. Further still, the technique has a highly parallel structure, which is well suited to parallel computing.

The ML-MRF technique can be augmented to integrate variable splitting, ADMM, and VARPRO to solve the resulting optimization problem. Doing so effectively improves the ML-MRF reconstruction. It is worth noting that the techniques described herein use a new formalism that provides new insights into characterizing MRF based reconstruction methods. The framework provided herein also offers a new way to address the computational challenges associated with direct parameter estimation from k-space data, which often arises in a wide variety of quantitative imaging problems. Representative examples include conventional MR parameter mapping, quantitative diffusion imaging, and water-fat imaging.

Figure 3:
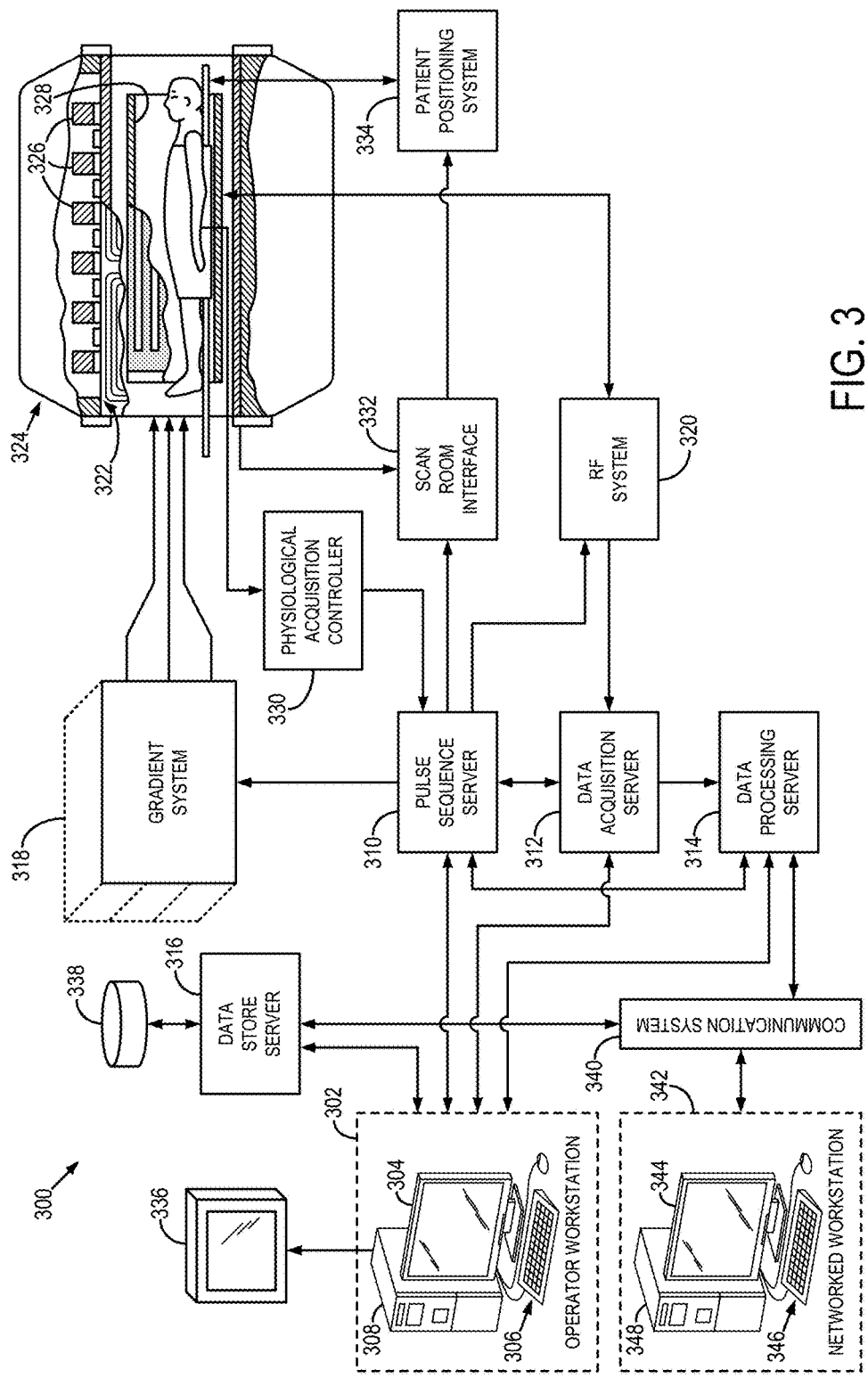
FIG. 3 is a block diagram of an example of a magnetic resonance imaging ("MRI") system configured for use in accordance with the present disclosure.

Referring now to FIG. 3, the above-described systems and methods may be implemented using or designed to accompany a magnetic resonance imaging ("MRI") system 300, such as is illustrated in FIG. 3. The MRI system 300 includes an operator workstation 302, which will typically include a display 304, one or more input devices 306 (such as a keyboard and mouse or the like), and a processor 308. The processor 308 may include a commercially available programmable machine running a commercially available operating system. The operator workstation 302 provides the operator interface that enables scan prescriptions to be entered into the MRI system 300. In general, the operator workstation 302 may be coupled to multiple servers, including a pulse sequence server 310; a data acquisition server 312; a data processing server 314; and a data store server 316. The operator workstation 302 and each server 310, 312, 314, and 316 are connected to communicate with each other. For example, the servers 310, 312, 314, and 316 may be connected via a communication system 340, which may include any suitable network connection, whether wired, wireless, or a combination of both. As an example, the communication system 340 may include both proprietary or dedicated networks, as well as open networks, such as the internet.

The pulse sequence server 310 functions in response to instructions downloaded from the operator workstation 302 to operate a gradient system 318 and a radiofrequency ("RF") system 320. Gradient waveforms to perform the prescribed scan are produced and applied to the gradient system 318, which excites gradient coils in an assembly 322 to produce the magnetic field gradients $G_x$, $G_y$, $G_z$ used for position encoding magnetic resonance signals. The gradient coil assembly 322 forms part of a magnet assembly 324 that includes a polarizing magnet 326 and a whole-body RF coil 328.

RF waveforms are applied by the RF system 320 to the RF coil 328, or a separate local coil (not shown in FIG. 3), in order to perform the prescribed magnetic resonance pulse sequence. Responsive magnetic resonance signals detected by the RF coil 328, or a separate local coil, are received by the RF system 320, where they are amplified, demodulated, filtered, and digitized under direction of commands produced by the pulse sequence server 310. The RF system 320 includes an RF transmitter for producing a wide variety of RF pulses used in MRI pulse sequences. The RF transmitter is responsive to the scan prescription and direction from the pulse sequence server 310 to produce RF pulses of the desired frequency, phase, and pulse amplitude waveform. The generated RF pulses may be applied to the whole-body RF coil 328 or to one or more local coils or coil arrays.

The RF system 320 also includes one or more RF receiver channels. Each RF receiver channel includes an RF preamplifier that amplifies the magnetic resonance signal received by the coil 328 to which it is connected, and a detector that detects and digitizes the I and Q quadrature components of the received magnetic resonance signal. The magnitude of the received magnetic resonance signal may, therefore, be determined at any sampled point by the square root of the sum of the squares of the I and Q components:

$$M = \sqrt{I^2 + Q^2}$$

and the phase of the received magnetic resonance signal may also be determined according to the following relationship:

$$\varphi = \tan^{-1}\left(\frac{Q}{I}\right). \qquad \text{Eqn. 26}$$

The pulse sequence server 310 also optionally receives patient data from a physiological acquisition controller 330. By way of example, the physiological acquisition controller 330 may receive signals from a number of different sensors connected to the patient, such as electrocardiograph ("ECG") signals from electrodes, or respiratory signals from a respiratory bellows or other respiratory monitoring device. Such signals are typically used by the pulse sequence server 310 to synchronize, or "gate," the performance of the scan with the subject's heart beat or respiration.

The pulse sequence server 310 also connects to a scan room interface circuit 332 that receives signals from various sensors associated with the condition of the patient and the magnet system. It is also through the scan room interface circuit 332 that a patient positioning system 334 receives commands to move the patient to desired positions during the scan.

The digitized magnetic resonance signal samples produced by the RF system 320 are received by the data acquisition server 312. The data acquisition server 312 operates in response to instructions downloaded from the operator workstation 302 to receive the real-time magnetic resonance data and provide buffer storage, such that no data is lost by data overrun. In some scans, the data acquisition server 312 does little more than pass the acquired magnetic resonance data to the data processor server 314. However, in scans that require information derived from acquired magnetic resonance data to control the further performance of the scan, the data acquisition server 312 is programmed to produce such information and convey it to the pulse sequence server 310. For example, during prescans, magnetic resonance data is acquired and used to calibrate the pulse sequence performed by the pulse sequence server 310. As another example, navigator signals may be acquired and used to adjust the operating parameters of the RF system 320 or the gradient system 318, or to control the view order in which k-space is sampled. In still another example, the data acquisition server 312 may also be employed to process magnetic resonance signals used to detect the arrival of a contrast agent in a magnetic resonance angiography ("MRA") scan. By way of example, the data acquisition server 312 acquires magnetic resonance data and processes it in real-time to produce information that is used to control the scan.

The data processing server 314 receives magnetic resonance data from the data acquisition server 312 and processes it in accordance with instructions downloaded from the operator workstation 302. Such processing may, for example, include one or more of the following: reconstructing two-dimensional or three-dimensional images by performing a Fourier transformation of raw k-space data; performing other image reconstruction techniques, such as iterative or backprojection reconstruction techniques; applying filters to raw k-space data or to reconstructed images; generating functional magnetic resonance images; calculating motion or flow images; and so on.

Images reconstructed by the data processing server 314 are conveyed back to the operator workstation 302. Images may be output to operator display 312 or a display 336 that is located near the magnet assembly 324 for use by attending clinician. Batch mode images or selected real time images are stored in a host database on disc storage 338. When such images have been reconstructed and transferred to storage, the data processing server 314 notifies the data store server 316 on the operator workstation 302. The operator workstation 302 may be used by an operator to archive the images, produce films, or send the images via a network to other facilities.

The MRI system 300 may also include one or more networked workstations 342. By way of example, a networked workstation 342 may include a display 344, one or more input devices 346 (such as a keyboard and mouse or the like), and a processor 348. The networked workstation 342 may be located within the same facility as the operator workstation 302, or in a different facility, such as a different healthcare institution or clinic. The networked workstation 342 may include a mobile device, including phones or tablets.

The networked workstation 342, whether within the same facility or in a different facility as the operator workstation 302, may gain remote access to the data processing server 314 or data store server 316 via the communication system 340. Accordingly, multiple networked workstations 342 may have access to the data processing server 314 and the data store server 316. In this manner, magnetic resonance data, reconstructed images, or other data may exchanged between the data processing server 314 or the data store server 316 and the networked workstations 342, such that the data or images may be remotely processed by a networked workstation 342. This data may be exchanged in any suitable format, such as in accordance with the transmission control protocol ("TCP"), the internet protocol ("IP"), or other known or suitable protocols.

Figure 4:
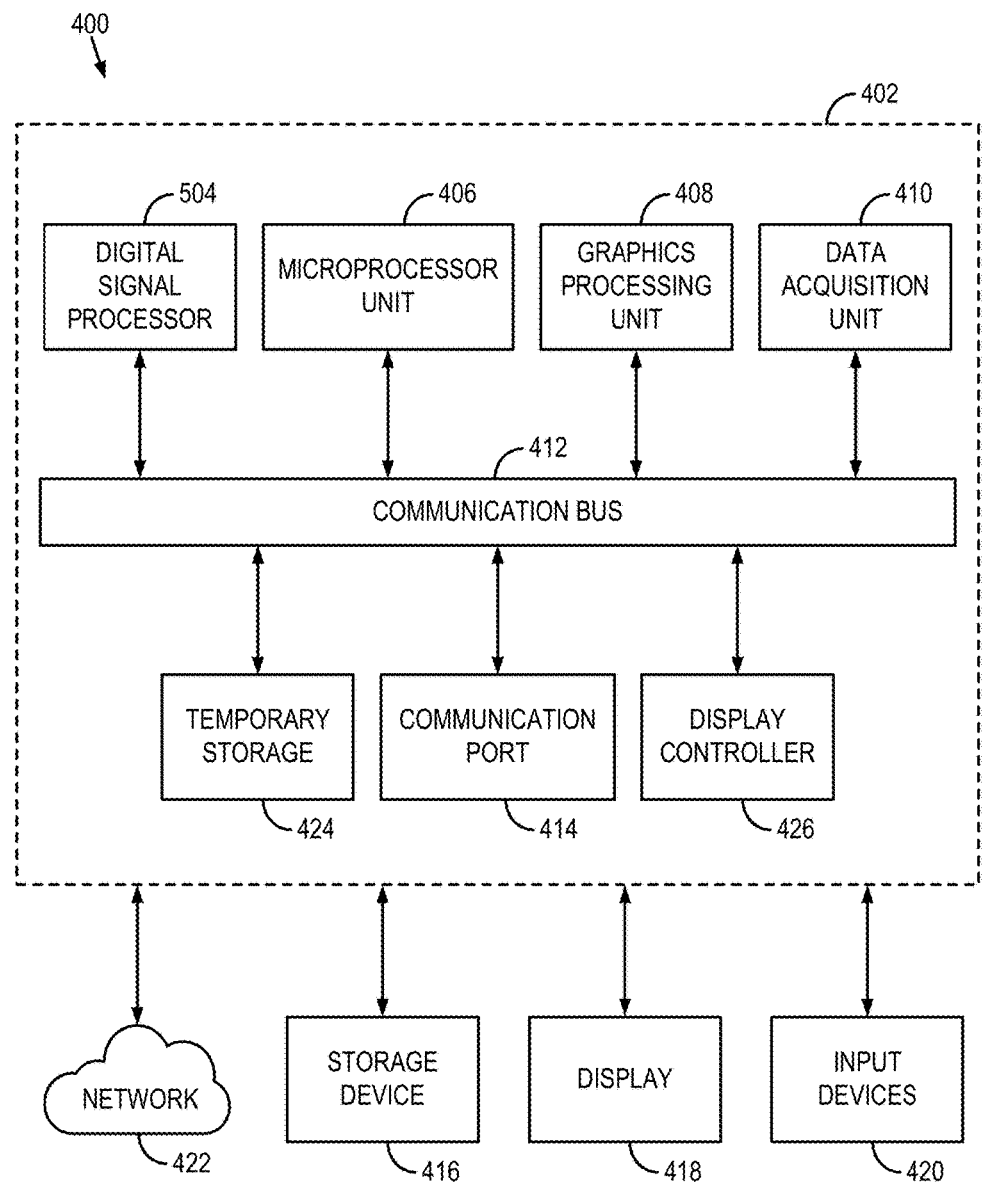
FIG. 4 is a block diagram of an example computer system that can be configured to implement the methods described herein.

Beyond the above-described MRI system, the systems and methods described herein may be performed using a computer system that is separate from an MRI system that is used to acquire imaging or MRF data. Referring now to FIG. 4, a block diagram of an example computer system 400 that can be configured to reconstruct magnetic resonance images using a ML-MRF reconstruction process, as described above, is illustrated. The data from which the magnetic resonance images are reconstructed can be provided to the computer system 400 from the respective MRI system and received in a processing unit 402.

In some configurations, the processing unit 402 can include one or more processors. As an example, the processing unit 402 may include one or more of a digital signal processor ("DSP") 404, a microprocessor unit ("MPU") 406, and a graphics processing unit ("GPU") 408. The processing unit 402 can also include a data acquisition unit 410 that is configured to electronically receive data to be processed, which may include magnetic resonance image data. The DSP 404, MPU 406, GPU 408, and data acquisition unit 410 are all coupled to a communication bus 412. As an example, the communication bus 412 can be a group of wires, or a hardwire used for switching data between the peripherals or between any component in the processing unit 402.

The DSP 404 can be configured to receive and processes the magnetic resonance data or reconstructed magnetic resonance images. The MPU 406 and GPU 408 can also be configured to process the magnetic resonance data or reconstructed magnetic resonance images in conjunction with the DSP 404. As an example, the MPU 406 can be configured to control the operation of components in the processing unit 402 and can include instructions to perform reconstruction of the magnetic resonance image data on the DSP 404. Also as an example, the GPU 408 can process image graphics.

In some configurations, the DSP 404 can be configured to process the magnetic resonance image data received by the processing unit 402 in accordance with the techniques described above. Thus, the DSP 404 can be configured to reconstruct magnetic resonance images or MRF images using the described above ML-MRF process.

The processing unit 402 preferably includes a communication port 414 in electronic communication with other devices, which may include a storage device 416, a display 418, and one or more input devices 420. Examples of an input device 420 include, but are not limited to, a keyboard, a mouse, and a touch screen through which a user can provide an input.

The storage device 416 is configured to store images, whether provided to or processed by the processing unit 402. The display 418 is used to display images, such as images that may be stored in the storage device 416, and other information. Thus, in some configurations, the storage device 416 and the display 418 can be used for displaying reconstructed magnetic resonance images.

The processing unit 402 can also be in electronic communication with a network 422 to transmit and receive data, including CT images, MR images, and other information. The communication port 414 can also be coupled to the processing unit 402 through a switched central resource, for example the communication bus 412.

The processing unit 402 can also include a temporary storage 424 and a display controller 426. As an example, the temporary storage 424 can store temporary information. For instance, the temporary storage 424 can be a random access memory.

The present invention has been described in terms of one or more preferred embodiments, and it should be appreciated that many equivalents, alternatives, variations, and modifications, aside from those expressly stated, are possible and within the scope of the invention.

The invention claimed is:

1. A magnetic resonance imaging (MRI) system comprising:
   a magnet system configured to generate a polarizing magnetic field about at least a portion of a subject arranged in the MRI system;
   a plurality of gradient coils configured to apply a gradient field to the polarizing magnetic field;
   a radio frequency (RF) system configured to apply an excitation field to the subject and acquire MR image data from a ROI;
   a computer system programmed to:
   control the plurality of gradient coils and the RF system to acquire magnetic resonance fingerprinting (MRF) data from a subject; and
   perform an iterative, maximum-likelihood reconstruction of the MRF data to create magnetic resonance (MR) tissue parameter maps of the subject.

2. The system of claim 1 wherein the iterative maximum-likelihood reconstruction models data, including the Bloch equation based magnetization dynamics and noise characteristics of the MRF data.

3. The system of claim 1 wherein the computer system is programmed to perform the iterative maximum-likelihood reconstruction by estimating tissue parameters directly from the MRF data without reconstructing contrast-weighted images.

4. The system of claim 3 wherein, to perform the maximum-likelihood reconstruction, the computer system is further programmed to analyze the estimated tissue parameters for convergence and, if convergence is not reached, perform an iteration to estimate updated tissue parameters from the MRF data.

5. The system of claim 1 wherein, to perform the maximum-likelihood reconstruction, the computer system is further programmed to represent an image reconstructed from the MRF data as:

$$I_m = \Phi_m(T_1, T_2, f_0)\rho$$

wherein $T_1$ denotes longitudinal relaxation time, $T_2$ denotes transverse relaxation time, $\rho$ denotes spin density, $f_0$ and denotes off-resonance frequency, where both $I_m$ and $\rho$ are $N \times 1$ complex vectors, $T_1$, $T_2$, and $f_0$ are all $N \times 1$ real vectors, and $\Phi_m(\bullet) \in \mathcal{L}^{N \times N}$ is a diagonal matrix with $[\Phi_m]_{n,n} = \phi_m(T_1[n], T_2[n], f_0[n])$.

6. The system of claim 5 wherein, to perform the maximum-likelihood reconstruction, the computer system is programmed to solve a maximum likelihood estimation problem of:

$$\{\hat{T}_1, \hat{T}_2, \hat{f}_0, \hat{\rho}\} = \arg\min_{T_1, T_2, f_0, \rho} \sum_{c=1}^{N_c} \sum_{m=1}^{M} \|d_{m,c} - F_m S_c \Phi_m(T_1, T_2, f_0)\rho\|_2^2$$

wherein $F_m \in \mathcal{L}^{P \times N}$ denotes the undersampled Fourier encoding matrix, $S_c \in \mathcal{L}^{N \times N}$ is a diagonal matrix whose diagonal entries contain the coil sensitivities, $n_m \in \mathcal{L}^{P \times 1}$ denotes the noise vector, and $d_{m,c} = F_m S_c \Phi_m(T_1, T_2, f_0)\rho + n_{m,c}$, assuming that $\{n_{m,c}\}_{m,c=1}^{M, N_c}$ is Gaussian noise.

7. The system of claim 1 wherein the computer system is further programmed to solve an optimization problem presented by the maximum-likelihood reconstruction using at least one of a variable-splitting technique, an alternating direction method of multipliers (ADMM), and a variable projection (VARPRO) method.

8. The system of claim 7 wherein the variable splitting-technique separates a Bloch equation based physical model from a data consistency constraint.

9. The system of claim 1 wherein performing the maximum-likelihood reconstruction includes finding a maximum-likelihood optimal solution.

10. The system of claim 1 wherein, to create MR tissue parameter maps of the subject, the computer system is further programmed to compute bounding theoretical error-bars for tissue parameters that form the MR tissue parameter maps.

11. The system of claim 10 wherein the computer system is further programmed to calculate a Cramer-Rao bound (CRB) to provide error bars for tissue parameter estimates.

* * * * *

UNITED STATES PATENT AND TRADEMARK OFFICE
CERTIFICATE OF CORRECTION

PATENT NO. : 10,241,176 B2
APPLICATION NO. : 15/409378
DATED : March 26, 2019
INVENTOR(S) : Bo Zhao et al.

Page 1 of 1

It is certified that error appears in the above-identified patent and that said Letters Patent is hereby corrected as shown below:

In the Specification

Column 6, Line 40, "$\{h^{m,c}\}_{m,c=1}^{M,N_c}$" should be --$\{h_{m,c}\}_{m,c=1}^{M,N_c}$--.

Column 12, Line 58, "Iand" should be --I and--.

Signed and Sealed this
Fourteenth Day of May, 2019

Andrei Iancu
*Director of the United States Patent and Trademark Office*